(12) United States Patent
Shah et al.

(10) Patent No.: US 10,775,450 B1
(45) Date of Patent: Sep. 15, 2020

(54) ZERO FIELD PARAMETRIC RESONANCE MAGNETOMETER WITH TRIAXIAL SENSITIVITY

(71) Applicant: QuSpin, Inc., Louiville, CO (US)

(72) Inventors: Vishal Shah, Superior, CO (US); Cody Doyle, Broomfield, CO (US); James Osborne, Erie, CO (US)

(73) Assignee: Quspin, Inc., Louisville, CO (US)

( * ) Notice: Subject to any disclaimer, the term of this patent is extended or adjusted under 35 U.S.C. 154(b) by 0 days.

(21) Appl. No.: 16/833,576

(22) Filed: Mar. 28, 2020

(51) Int. Cl.
*G01R 33/02* (2006.01)
*G01R 33/26* (2006.01)
*G01R 33/032* (2006.01)
*G02B 27/28* (2006.01)
*G01R 33/12* (2006.01)

(52) U.S. Cl.
CPC ....... *G01R 33/0206* (2013.01); *G01R 33/032* (2013.01); *G01R 33/1284* (2013.01); *G01R 33/26* (2013.01); *G02B 27/283* (2013.01)

(58) Field of Classification Search
CPC .......................... G01R 33/0206; G01R 33/032
USPC ........................................................ 324/301
See application file for complete search history.

(56) References Cited

U.S. PATENT DOCUMENTS

| | | | |
|---|---|---|---|
| 3,629,697 A | 12/1971 | Bouchiat et al. | |
| 3,786,340 A | 1/1974 | Farr et al. | |
| 4,005,355 A | 1/1977 | Flapper et al. | |
| 4,814,706 A | 3/1989 | Rempt | |
| 4,841,772 A | 6/1989 | Paik | |
| 5,243,403 A | 9/1993 | Koo et al. | |
| 5,270,648 A | 12/1993 | Watson | |
| 5,329,269 A | 7/1994 | Watson | |
| 5,519,318 A | 5/1996 | Koerner et al. | |
| 6,841,994 B1 | 1/2005 | Wiegert | |
| 6,888,353 B1 | 5/2005 | Wiegert | |
| 7,688,072 B1 | 3/2010 | Wiegert et al. | |
| 8,212,556 B1 | 7/2012 | Schwindt et al. | |
| 8,471,557 B2 | 6/2013 | Baldo et al. | |
| 8,525,514 B2 | 9/2013 | Cai et al. | |
| 8,760,156 B2 | 6/2014 | Baldo et al. | |

(Continued)

FOREIGN PATENT DOCUMENTS

| | | |
|---|---|---|
| CA | 2220346 B1 | 9/2005 |
| CN | 105487026 A1 | 4/2016 |
| CN | 103913709 B1 | 5/2017 |

OTHER PUBLICATIONS

NASA—NSSDCA triaxial fluxgate magnetometer, 1973.

(Continued)

*Primary Examiner* — Reena Aurora
(74) *Attorney, Agent, or Firm* — Patricia C. Brzostowicz; Superior Patent Group, LLC

(57) ABSTRACT

This disclosure relates to the field of zero-field paramagnetic resonance magnetometer (ZF-PRM). A sensitive ZF-PRM capable of measuring magnetic field in three orthogonal directions simultaneously and method of measuring magnetic field in three orthogonal directions is described. The ZF-PRM provides three independent output signals proportional to the three orthogonal vector components of the magnetic field using a single vapor cell, thus reducing complexity and cost of the magnetometer. Because all three magnetic components are measured at substantially the same location at the same time, the accuracy of data is greatly increased.

20 Claims, 12 Drawing Sheets

(56) References Cited

U.S. PATENT DOCUMENTS

| | | | |
|---|---|---|---|
| 8,818,747 B2 | 8/2014 | Weiss et al. | |
| 8,917,091 B2 * | 12/2014 | Le Prado | G01C 19/62 324/244 |
| 8,922,205 B2 | 12/2014 | Liu | |
| 9,116,198 B2 | 8/2015 | Cai et al. | |
| 9,116,201 B2 | 8/2015 | Shah | |
| 2016/0223627 A1 * | 8/2016 | Shah | G01R 33/26 |
| 2019/0250223 A1 * | 8/2019 | Palacios Laloy | G01R 33/032 |

OTHER PUBLICATIONS

Jiancheng Fang Jie Qin Rev. Sci. Instrum. 83, 103104 (2012); https://doi.org/10.1063/1.4756046 Submitted: Aug. 6, 2012 . Accepted: Sep. 16, 2012. Published Online: Oct. 9, 2012.

Boto, Elena, Niall Holmes, James Leggett, Gillian Roberts, Vishal Shah, Sofie S. Meyer, Leonardo Duque Muñoz, et al. 2018. "Moving Magnetoencephalography towards Real-World Applications with a Wearable System." Nature 555 (7698): 657-61. https://doi.org/10.1038/nature26147.

Budker, Dmitry, and Michael Romalis. 2007. "Optical Magnetometry." Nat Phys 3 (4): 227-34. https://doi.org/10.1038/nphys566.

Dong, H.f., J.c. Fang, B.q. Zhou, X.b. Tang, and J. Qin. 2012. "Three-Dimensional Atomic Magnetometry." The European Physical Journal—Applied Physics 57 (02): null-null. https://doi.org/10.1051/epjap/2011110392.

Dupont-Roc, J., S. Haroche, and C. Cohen-Tannoudji. 1969. "Detection of Very Weak Magnetic Fields (10-9gauss) by 87Rb Zero-Field Level Crossing Resonances." Physics Letters A 28 (9): 638-39. https://doi.org/10.1016/0375-9601 (69)90480-0.

Happer, W., and B. S. Mathur. 1967. "Effective Operator Formalism in Optical Pumping." Physical Review 163 (1): 12. https://doi.org/10.1103/PhysRev.163.12.

Huang, H. C., H. F. Dong, X. Y. Hu, L. Chen, and Y. Gao. 2015. "Three-Axis Atomic Magnetometer Based on Spin Precession Modulation." Applied Physics Letters 107 (18): 182403. https://doi.org/10.1063/1.4935096.

Huang, Haichao, Haifeng Dong, Lin Chen, and Yang Gao. 2016. "Single-Beam Three-Axis Atomic Magnetometer." Applied Physics Letters 109 (6): 062404.

Marie-Anne, Bouchiat, Brossel Jean, Cohen-Tannoudji Claude N, Dupont-Roc Jacques A, Haroche Serge, Kastler Alfred H, and Lehmann Jean-Claude. 1971. Paramagnetic resonance and optical pumping magnetometer in the near zero magnetic field-range. U.S. Pat. No. 3,629,697 A, filed Dec. 10, 1969, and issued Dec. 21, 1971. http://www.google.com/patents/US3629697.

Schwindt, Peter, and Cort N. Johnson. 2012. Atomic magnetometer. United States U.S. Pat. No. 8,212,556B1, filed Jan. 12, 2010, and issued Jul. 3, 2012.

Seltzer, S. J., and M. V. Romalis. 2004. "Unshielded Three-Axis Vector Operation of a Spin-Exchange-Relaxation-Free Atomic Magnetometer." Applied Physics Letters 85 (20): 4804-6. https://doi.org/doi:10.1063/1.1814434.

Shah, V., and M. V. Romalis. 2009. "Spin-Exchange Relaxation-Free Magnetometry Using Elliptically Polarized Light." Physical Review A 80 (1): 013416. https://doi.org/10.1103/PhysRevA.80.013416.

Shah, Vishal, Svenja Knappe, Peter D. D. Schwindt, and John Kitching. 2007. "Subpicotesla Atomic Magnetometry with a Microfabricated Vapour Cell." Nat Photon 1 (11): 649-52. https://doi.org/10.1038/nphoton.2007.201.

Slocum, Robert E., and Francis N. Reilly. 1963. "Low Field Helium Magnetometer for Space Applications." IEEE Transactions on Nuclear Science 10 (1): 165-71. https://doi.org/10.1109/TNS.1963.4323257.

* cited by examiner

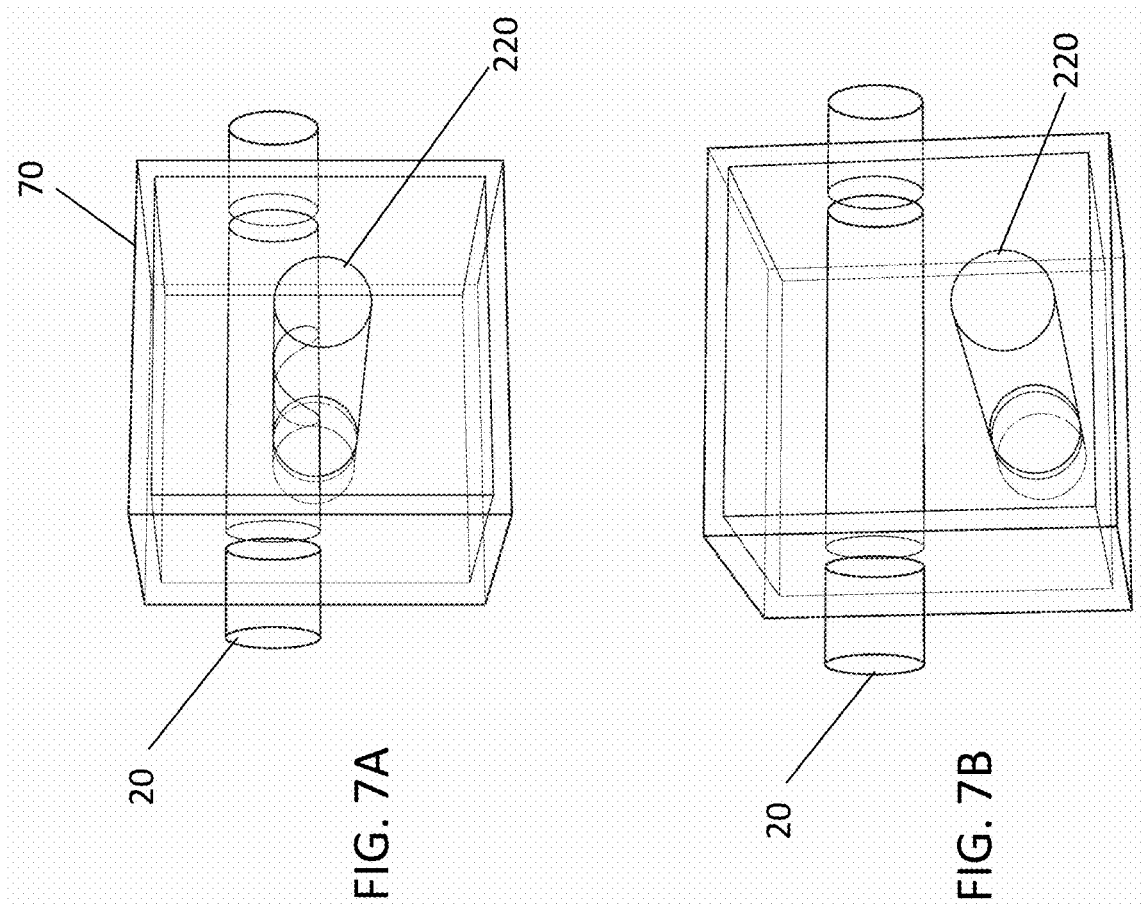

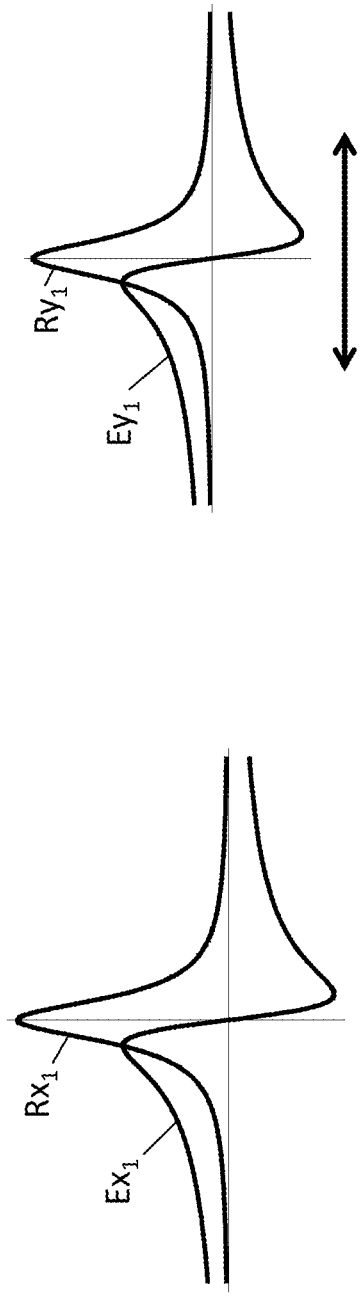
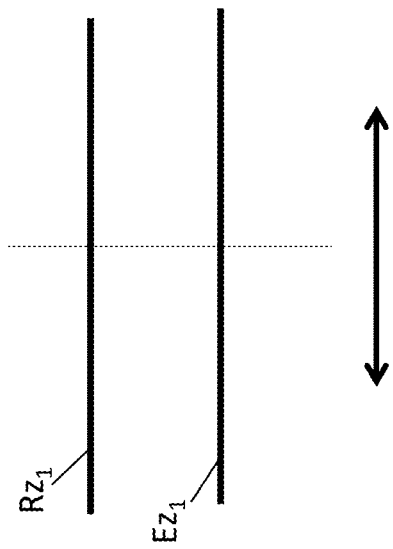
FIG. 8A Bx direction
FIG. 8B By direction
FIG. 8C Bz direction

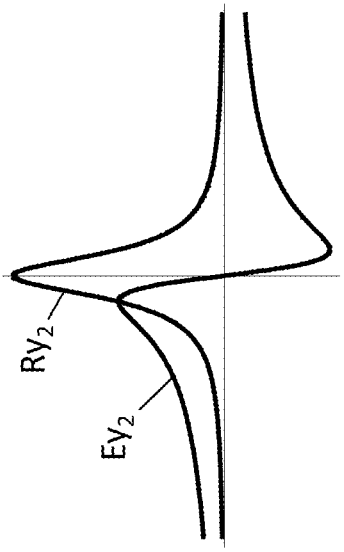
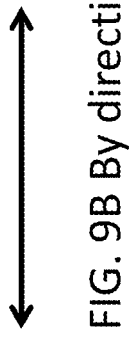
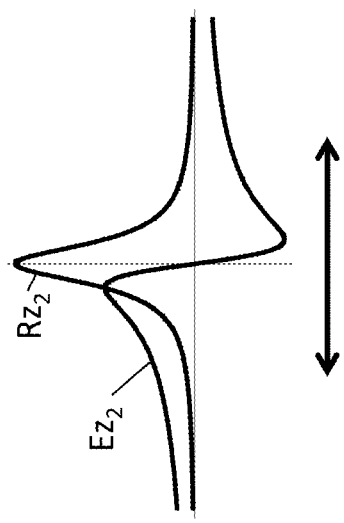
FIG. 9A Bx direction
FIG. 9B By direction
FIG. 9C Bz direction

ZERO FIELD PARAMETRIC RESONANCE MAGNETOMETER WITH TRIAXIAL SENSITIVITY

The following is an application for patent under 35 USC 111 (a). This disclosure was made with government support under R44MH123492 awarded by the National Institutes of Health. The government has certain rights to the apparatus and method.

BACKGROUND

High sensitivity magnetometers, including zero-field paramagnetic resonance magnetometers (ZF-PRM) as described by Slocum and Reilly in 1963 (Slocum and Reilly 1963), have a wide range of applications including, but not limited to fundamental research, detecting biomagnetic signals such as those emanating from biological organisms including the human body, geophysical exploration and prospecting, navigation and space applications, and military uses such as ordinance and underground-underwater structure detection. Until recently, the most sensitive commercially available magnetometer for such applications was the superconducting quantum interference device (SQUID) (Weinstock 1996). However, zero-field paramagnetic resonance magnetometers (Dupont-Roc, Haroche, and Cohen-Tannoudji 1969; Marie-Anne et al. 1971; Vishal Shah et al. 2007), which have advanced to comparable sensitivity as SQUID systems, have recently gained popularity as a lower-cost, more robust alternative to SQUID magnetometers for many applications.

Significant developments in alkali atomic magnetometery (Budker and Romalis 2007) over the past decade have led to a variety of techniques and methods for sensing magnetic fields. In general, the different methods are based on the same fundamental physical sensing mechanism that exploits the energy structure of atoms and the perturbations that result in their energy levels, or spin state, from exposure to external magnetic fields. Atomic based magnetic sensors measure the direction and magnitude of an external magnetic field through the induced changes in the atomic spin polarization of an ensemble of atoms.

A zero field parametric resonance magnetometer (ZF-PRM) relies on detecting changes in optical transmission properties of spin polarized atomic vapor in a narrow magnetic field range centered on absolute zero magnetic field. The optical transmission properties of the polarized atomic vapor in ZF-PRM change substantially when magnetic field, in a direction perpendicular to the direction of the atomic spin polarization, changes. However, little or no change is observed when there is a change in magnetic field parallel to the direction of the atomic spins. Consequently, ZF-PRM is primarily sensitive to magnetic field in just one or two orthogonal directions perpendicular to the atomic spin polarization, and not sensitive to magnetic field in the third direction which is parallel to the direction of the atomic spin polarization. In many scientific, research, and biomedical applications, measurement of all three orthogonal vector components of the magnetic field is necessary.

SUMMARY

Here we disclose a simple apparatus capable of obtaining magnetic field measurement in all three directions with an improved ZF-PRM device. Further, we describe a method for measuring magnetic field in all three directions. The triaxial ZF-PRM of the present disclosure may simultaneously measure all three orthogonal vector components of a magnetic field with high sensitivity using a single atomic vapor cell. In addition, this ZF-PRM may operate to measure at least one direction, two directions, or the three orthogonal directions of the magnetic field at one time. The apparatus and method disclosed herein has the following advantages: (i) provides simultaneous measurement of all three vectors components at substantially the same location, (ii) measures all three components with equally high sensitivity, (iii) requires only a single light source and vapor cell, and (iv) is robust.

The present apparatus and method address a longstanding need recognized by those skilled in the art of building and operating ZF-PRMs. Slocum and Reilly (1963) described a method to operate a helium based ZF-PRM in triaxial mode using synchronous phase demodulation of rotating fields in two orthogonal directions. Slocum first applied a 90-degree phase offset modulation fields in the X (optical axis) and Y direction to obtain the magnitude of the magnetic field in the X and Y directions. Next, Slocum applied a 90-degress phase offset modulation in the X and Z direction to obtain the magnitude of the magnetic field in the X and Z directions. Slocum proposed alternating between XY and XZ modulation at a predefined rate to obtain magnetic field information in all three axes. The main drawback of Slocum's method is that it does not provide a simultaneous measurement of the magnetic field in all three axes. In addition, in Slocum, the sensitivity of the magnetometer in the X direction is lower compared to the sensitivity in the Y and Z directions.

Dong et al. and H. Huang et al. demonstrated that it is possible to operate a single beam ZF-PRM in triaxial mode by applying three separate orthogonal modulation fields at different frequencies or phases (H. C. Huang et al. 2015; H. Huang et al. 2016; Dong et al. 2012). The main downside of their approach is that the magnetometer sensitivity in the direction along the optical axis is much lower compared with the sensitivity obtained in directions perpendicular to the optical axis. Seltzer and Romalis (2004) described a similar modulation apparatus to obtain sensitivity along all three-axis using a two beam pump-probe configuration ZF-PRM. Although not explicitly highlighted in the publication, from their equation (5) it is evident that their magnetometer also suffers from reduced sensitivity in the direction of the pump beam.

In contrast to the present disclosure, in prior art pump-probe magnetometers (Seltzer and Romalis 2004; Fang and Qin 2012), the measurement volume that produces the magnetometer output is given by the region in which the pump and the probe beams overlap.

Other commercial ZF-PRM magnetometers, for example the QuSpin QZFM Gen-1 magnetometer (Osborne et al. 2018), are sensitive to magnetic fields in one or two axes. To obtain high sensitivity in all three directions with these sensors, two or more single or dual axis ZF-PRM sensors may be placed near each other at right angles to measure magnetic fields in all three complementary directions as described by Boto et al. (2018). The downside of this approach of combining multiple magnetometers to obtain triaxial field measurement is that such a device doubles or even triples the size, weight, power consumption, and cost of the combined magnetometer device. In addition, these combined single/dual axis magnetometers do not achieve measurement of all three components of magnetic field at the same location which creates measurement bias that can be difficult to remove.

A prior art single beam ZF-PRM 101, as shown in FIG. 1, primarily consists of a light or light beam 20, an alkali vapor cell 70 and a photodetector 90. In summary, the light beam 20 is circularly polarized and its wavelength adjusted such that the light is resonant with the D1 line of alkali atoms 60 inside the vapor cell 70. As shown in FIG. 2, in zero magnetic field, the alkali atoms 60 in the path of the light beam 20 are polarized by the circularly polarized light beam 20 such that the spins of the alkali atoms 60A that the beam 20 falls on are aligned along the direction of the light beam. When the alkali spins are aligned with the beam, they absorb very little laser light. Therefore, the light beam 20 passes on to the photodetector or photodiode 90 substantially unaffected by the alkali atoms 60 inside the vapor cell 70.

When a magnetic field orthogonal to the direction of the light beam is present, the orthogonal magnetic field applies a torque on the spins which rotates the orientation of spin polarized alkali atoms 60A and causes a misalignment between the light beam and alkali spins. As a result of the misalignment, the alkali atoms start absorbing light from the beam which changes the amount of light falling on the photodetector. From a change in the amount of light falling on the photodetector, strength of the magnetic field in a direction orthogonal to the light beam is inferred by the ZF-PRM. However, when a magnetic field parallel to the light beam is present, no torque is applied on the alkali spins and consequently the orientation of alkali spins is unaffected by the magnetic field. Therefore, the ZF-PRM cannot sense magnetic field parallel to the direction of the light beam.

In the triaxial ZF-PRM apparatus of the present disclosure FIG. 3, 301, in addition to the circularly polarized light beam 20, a second circularly polarized light beam 220, which travels substantially orthogonal to the first beam 20, is used. This second circularly polarized light beam 220 travels through the vapor cell 70, falling on the alkali atoms 60 and is detected by a second photodetector 290. The photodetector 90 can measure the perturbance of light from magnetic fields orthogonal to beam 20 (x and y directions) and photodetector 290 can measure the perturbance of light from magnetic field orthogonal to beam 220 (in y and z directions). Together the output of the two photodetectors 90, 290 utilizing the same vapor cell 70 provide a measurement of magnetic field in all three directions.

The magnetic field measurements in the x and/or y direction made using beam 20 and photodetector 90 does not require the presence of beam 220 or photodetector 290. Similarly, the magnetic field measurements in the z and/or y direction made using beam 220 and photodetector 290 does not require the presence of either beam 20 or photodetector 90. Therefore, the magnetic field measurements made using photodetector 90 and photodetector 290 are substantially independent of one another.

If the two beams 20 and 220 overlap inside the vapor cell, the alkali spin polarization is adversely affected in the overlap region, denoted VO, or volume of overlap, volume O, and therefore for optimal performance the beam overlap volume must be reduced to the greatest extent possible. To minimize beam overlap, techniques known to persons skilled in art may be employed including reducing the diameter of the beams 20 and 220 to minimize beam overlap, and/or positioning or engineering the beams to create a small gap between the beams 20 and 220 to further reduce beam overlap region inside the vapor cell.

Inasmuch, the apparatus described and claimed herein is a zero-field paramagnetic resonance magnetometer (ZF-PRM) able to simultaneously measure magnetic field in three orthogonal directions at substantially the same location comprising: a first circularly polarized light beam, a vapor cell filled with alkali atoms and a buffer gas, and a first photodetector to detect changes in the magnetic field in a first and optionally second direction, wherein the detected changes using the first photodetector define a first measurement set, and the first and second directions are mutually orthogonal and orthogonal to the direction of propagation of the first light beam through the vapor cell; a second circularly polarized light beam, the vapor cell filled with alkali atoms and the buffer gas, and a second photodetector to detect changes in the magnetic field in a third and optionally the first or the second direction, wherein the detected changes using the second photodetector define a second measurement set, and the third and first or second directions are mutually orthogonal and orthogonal to the direction of propagation of the second light beam through the vapor cell; wherein the first and second light beams pass through the vapor cell in substantially orthogonal directions; wherein the first and second measurement sets are not dependent on each other; and wherein the first and the second measurement sets together measure magnetic field in all three substantially orthogonal directions.

The ZF-PRM described herein may further comprise a beam splitter, and the first and the second light beams may be generated by splitting light from a single light source. In the ZF-PRM of the present disclosure, the first and the second light beams may be generated by two separate light sources.

Further, the ZF-PRM described herein may be surrounded by a coil system that produces an oscillating magnetic field over the region of the vapor cell in two or more directions. The frequency of the oscillating magnetic field may be different in three mutually orthogonal directions. The oscillating magnetic field may be the same in at least two directions and different in a third direction. The frequency of the oscillating magnetic field may be the same in all three mutually orthogonal directions. The frequency of the oscillating magnetic field may be the same in all three mutually orthogonal directions and the phase of the oscillating magnetic field is offset by an amount substantially equal to pi/2 in at least two mutually orthogonal directions.

In the ZF-PRM described herein the buffer gas in the vapor cell may have a pressure greater than 100 torr. In the ZF-PRM a volume of beam overlap inside the vapor cell is defined as the space where the beams overlap inside the vapor cell, and the volume of beam overlap is substantially less than the total volume of both the beams occupy inside the vapor cell. Alternately, the first and the second beams may not overlap inside the vapor cell.

In other words, a triaxial ZF-PRM of the present disclosure may comprise: two circularly polarized light beams resonant with the D1 line of a group of alkali atoms; a single vapor cell filled with the group of alkali atoms and at least one buffer gas, wherein the two light beams are directed through the vapor cell at substantially orthogonal directions, and wherein the light beams occupy a volume within the vapor cell, and wherein an overlap volume is defined by the volume where the beams overlap inside the vapor cell, and wherein the overlap volume is substantially smaller than the total beam volumes in the vapor cell; and two photodiodes, wherein a first photodiode measures magnetic field in one or two directions orthogonal to the propagation direction of the beam detected by the first photodetect, and a second photodiode measures magnetic field in one or two directions orthogonal to the propagation direction of the beam detected by the second photodiode. The triaxial ZF-PRM may further comprise a beam splitter, wherein the first and the second light beams are generated by splitting light from a single light source.

A method for measuring magnetic frequency in three directions simultaneously is described and claimed herein, the method comprising the steps of: propagating two circularly polarized light beams through a vapor cell containing alkali atoms and at least one buffer gas at substantially orthogonal directions to each other, and wherein the light beams occupy a volume within the vapor cell, and wherein an overlap volume is defined by the volume where the beams overlap inside the vapor cell, and wherein the overlap volume is substantially smaller than the total beam volumes in the vapor cell; and using two separate photodetectors to detect the two beams after they pass through the vapor cell.

The method described herein may further comprise creating an oscillating magnetic field over the region of the vapor cell in two or more directions. The frequency of the oscillating magnetic field may be different in three mutually orthogonal directions. The frequency of the oscillating magnetic field may be the same in at least two directions and different in the third direction. The frequency of the oscillating magnetic field may be the same in all three mutually orthogonal directions. The frequency of the oscillating magnetic field may be the same in all three mutually orthogonal directions and the phase of the oscillating magnetic field is offset by an amount substantially equal to pi/2 in at least two mutually orthogonal directions. The method may further comprise pressurizing the vapor cell to a pressure greater than 100 torr.

BRIEF DESCRIPTION OF THE DRAWINGS

FIG. 7A is a schematic illustration of two light beams intersecting in the vapor cell of the present disclosure.

FIG. 7B is a schematic illustration of two non-overlapping light beams passing through the vapor cell of the present disclosure.

FIGS. 8A, 8B, and 8C are schematic illustrations of measurement in the x, y, and z directions (Bx, By, and Bz) with the first circularly polarized light beam of the triaxial ZF-PRM of the present disclosure.

FIGS. 9A, 9B, and 9C are schematic illustrations of measurement in the x, y, and z directions with the second circularly polarized light beam passing through the vapor cell in an orthogonal direction from the first circularly polarized light beam.

Before explaining the disclosed embodiments of the present apparatus and method in detail, it is to be understood that the disclosure is not limited in its application to the details of the particular arrangement shown, since the disclosed apparatus and method are capable of other embodiments. Also, the terminology used herein is for the purpose of description and not of limitation.

DETAILED DESCRIPTION OF THE INVENTION

Figure 1:
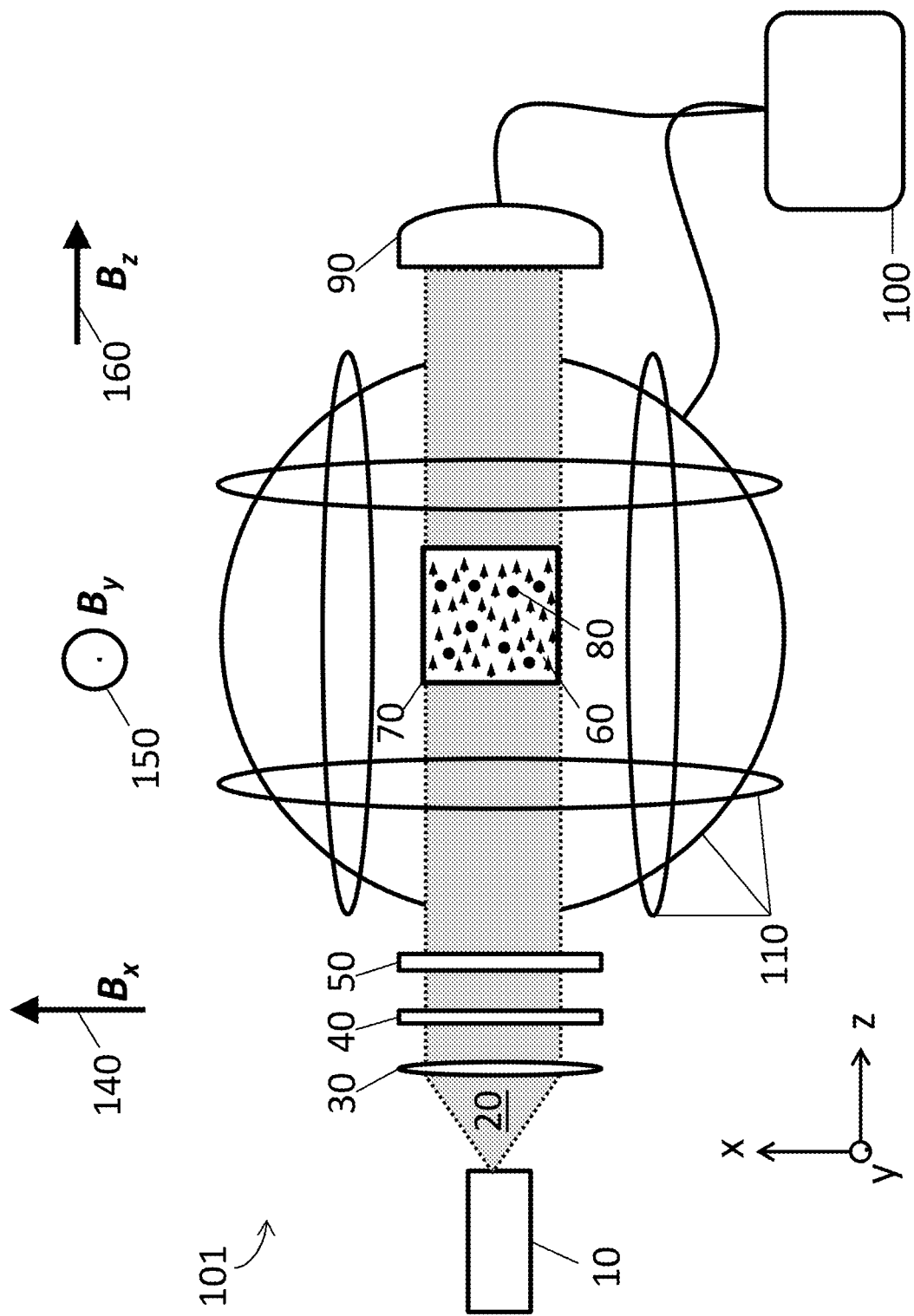
FIG. 1 is a schematic illustration of a prior art ZF-PRM.

Single beam zero field paramagnetic resonance magnetometers or ZF-PRM generally, as shown in prior art FIG. 1, are known in the art as described previously as in U.S. Pat. No. 3,629,697 to Bouchiat et al. and U.S. Pat. No. 4,005,355 to Flapper et al. The theory, construction, and operation of single beam ZF-PRMs is also described in prior art (Marie-Anne et al. 1971; W and E 1974). A ZF-PRM apparatus 101, comprises a cell 70 containing alkali atoms 60. The cell 70, which can be made of glass, or some other transparent material, can also include a buffer gas 80. The buffer gas may comprise a noble gas such as helium, argon, xenon or neon. Another gas such as nitrogen can also be used as buffer gas 80. The buffer gas may comprise of a mixture of gases or a single component gas. The cell 70 may be heated to an elevated temperature to provide a density of alkali metal atom vapors, which can range from at least about $10^7$ cm$^{-3}$ to at least about $10^{15}$ cm$^{-3}$ or more. The exact temperature to which the cell 70 is heated will depend. in general, upon the atomic species, or atoms (e.g. sodium, potassium, rubidium, or cesium), which is used in the apparatus. As an example, when the alkali metal comprises rubidium-87, the cell 70 may be heated to about room temperature or up to about 200° C. The cell 70 may be heated by locating the cell within an oven (not shown) or by placing it within thermal proximity to a heating element. The alkali atoms 60 employed may include rubidium, cesium, potassium, sodium, and helium.

In the ZF-PRM 101, a pump light beam 20, which can be generated by a laser 10, or a vapor lamp 10, may be directed through a linear polarizer 40 to linearly polarize the pump light beam 20. The linear polarizer 40 can be omitted if the pump light beam 20 is already linearly polarized. The pump light beam 20, which can have an optical power level of up to a few microWatts (μW) or more depending upon the size and temperature of the cell 70, can be expanded and substantially collimated by one or more lenses 30.

After being expanded and substantially collimated by the lenses 30, the pump light beam 20 may be directed through an optical waveplate 50, having a fast axis which is oriented at 45° with respect to a direction, e.g. vertical out of the plane of FIG. 1 or horizontal in the plane of FIG. 1, of the linear polarization of the pump light beam 20. In this way, the optical waveplate 50 converts the pump light beam 20, which was initially linearly polarized into being circularly polarized. The circularly polarized light in the beam 20 after passing through the optical waveplate 50 can be either right-handed circularly-polarized light or left-handed circularly-polarized light. After being transmitted through the optical waveplate 50, the pump light beam 20 is directed through the cell 70 containing the alkali metal vapor 60 or other alkali atoms or vapors. The cell may have lateral dimensions of each side of generally about one millimeter (mm), two mm, or three mm, or larger.

The optical waveplate 50 functions as a quarter waveplate at the wavelength of the pump light beam 20, which is substantially equal to the wavelength of a first or second D1 line atomic transition of the alkali metal vapor 60. D1 line is defined herein as a transition from a $n^2S_{1/2}$ ground state to a $m^2P_{1/2}$ excited state of the alkali metal atoms in the vapor 60 where n and m are integers. The pump light beam 20 need not be exactly on line center of the D1 transition, but can be tuned off the line center and onto the wines of the D1 transition.

The buffer gas 80, which may be helium, neon, or nitrogen, in the cell 70 is useful to slow down the rate at which the atoms of the alkali metal vapor 60 collide with the inner walls of the cell 70 which can randomize the spins of the alkali metal atoms. The buffer gas 80 pressure in the cell 70 can be, for example, in a range between about 50 torr or 100 torr and about 3000 torr, or higher.

The pump beam 20, after passing through the vapor cell 70, is collected by a photodetector 90, which provides a measure of the amount of light transmitted through the cell 70. Various types of photodetectors 90 may he used with detection capability in the wavelength range of the pump light beam 20. The output of the photodetector may be subsequently amplified using suitable low noise electronic amplifiers.

The ZF-PRM apparatus 101, the cell 70 alone, or a space or room where the ZF-PRM is housed, may be surrounded by a set of electrically activated magnetic coils 110. The set of coils 110 being three coils, one generating field in the x-direction, one generating field in the y-direction, and one generating field in the z-direction. Further, each coil may be a single coil, or additional coils to generate a homogenous magnetic field around the cell 70 in each of the three directions.

Figure 2:
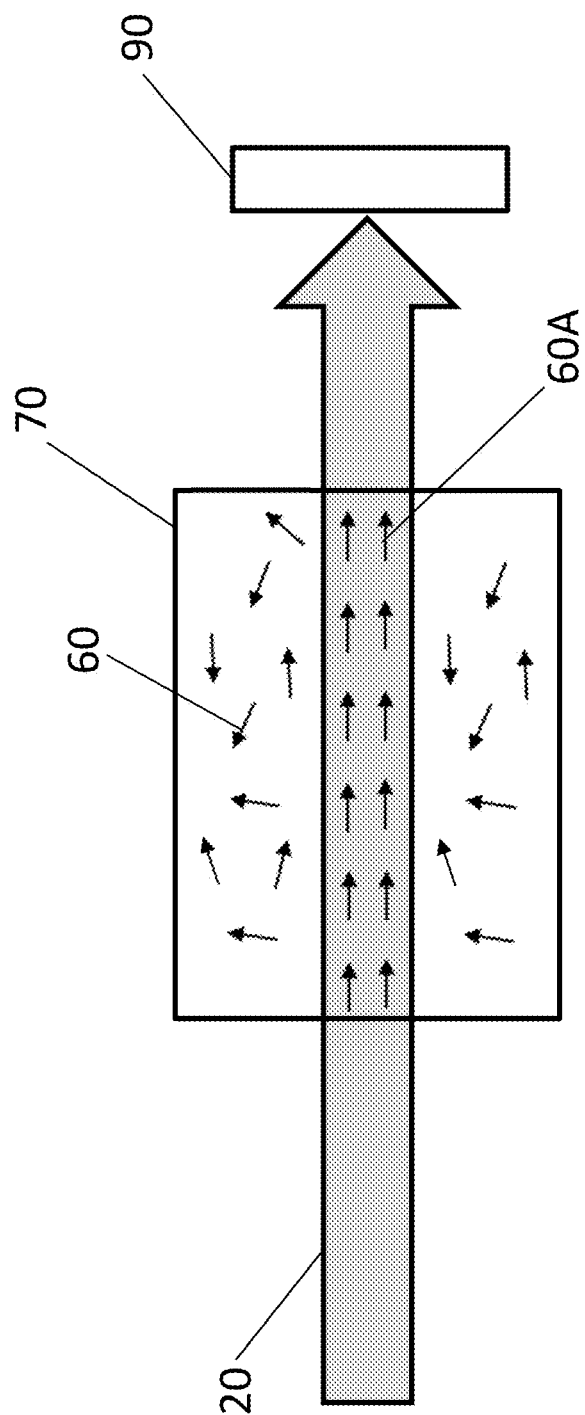
FIG. 2 is a schematic illustration of how in zero magnetic field, the alkali atoms in the path of the light beam are polarized by the light beam.

When the alkali atoms 60 in the cell 70 are in a substantially zero magnetic field environment, the circular polarization of the pump light beam 20 produced by the optical waveplate 50 aligns the nuclear and electron spins of the individual alkali metal atoms in the alkali metal vapor 70 from optical pumping process (Happer and Mathur 1967). As shown in FIG. 2, the optical pumping process re-orients the spins of the individual alkali metal atoms 60A so that they are in a magnetically polarized state aligned along the direction of the circularly polarized light beam 20, i.e. defined here as the z-direction.

Summarizing the operation of a ZF-PRM 101, illustrated by FIG. 1, the behavior of the spin polarization vector ($\vec{P}$) of alkali atoms 60 in a sensing cell 70 can be understood based on the Bloch equation (Allred et al. 2002):

$$\frac{d\vec{P}}{dt} = \gamma \vec{P} \times \vec{B} - R(\vec{P} - \vec{P}_0), \quad \text{Eq. 1}$$

where $\gamma$ is the gyromagnetic ratio of the alkali atoms 60, R is the combined optical pumping and relaxation rate, and $\vec{B}$ is the magnetic field to which alkali atoms are exposed. A representation of a magnetic field may be detected as a change in transmission of the light or pump light beam through the alkali atoms by a photodetector. Because the light beam 20 propagates in the z-direction in 101, the amount of light beam 20 transmitted through the vapor cell 70 is proportional to the steady state solution of the said equations along the z-direction, i.e.:

$$P_z = P_0 \frac{B_z^2 + \left(\frac{R}{\gamma}\right)^2}{B_x^2 + B_y^2 + B_z^2 + \left(\frac{R}{\gamma}\right)^2}, \quad \text{Eq. 2}$$

where $P_z$ is the component of the spin polarization vector, $\vec{P}$, in the z-direction.

Figure 4:
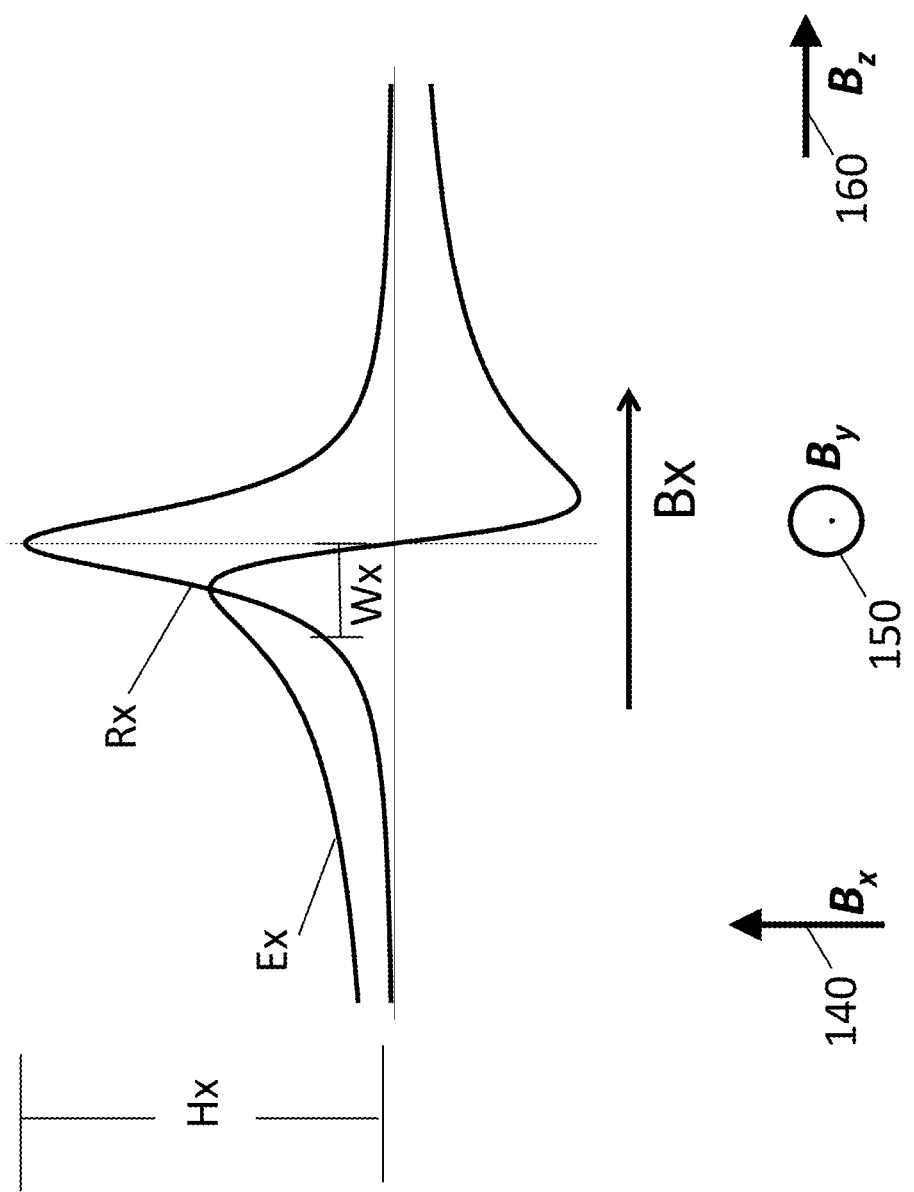
FIG. 4 schematic illustration of a magnetic field measurement from the X component direction.

When the cell 70 is in a zero field (ZF) environment, i.e. Bx=By=Bz=0, scanning the magnetic field, Bx 140, produces a narrow Lorentzian resonance, defined herein as the natural ZF resonance, which can be seen by monitoring the amplified output of the photodetector 90 on an oscilloscope. The resonance Rx, as shown in FIG. 4, is referred to in the prior art as the ZF resonance and has a height, Hx, and a width Wx. Because the photodetector output changes substantially as a function of the Bx field 140, the magnetometer is highly sensitive to changes in the magnetic field in the x-direction.

Figure 5:
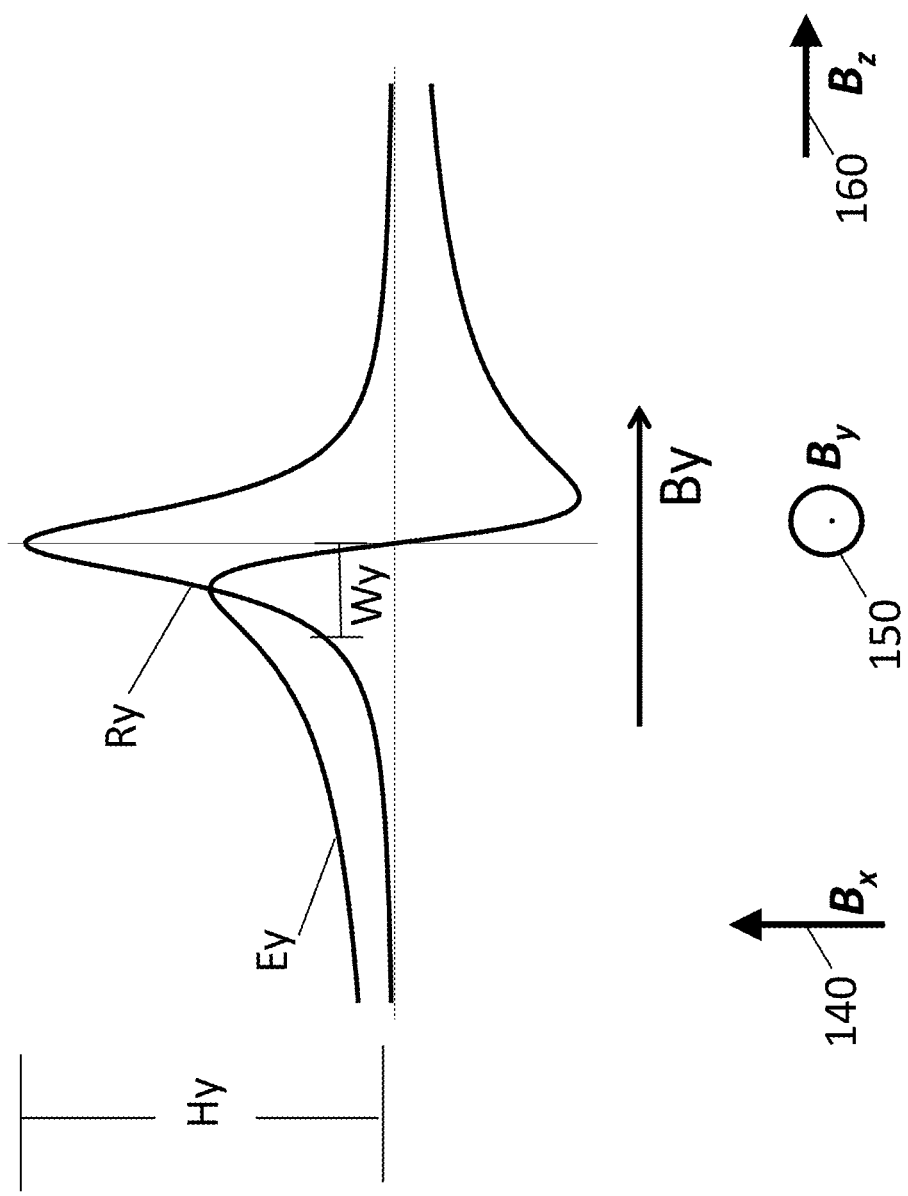
FIG. 5 is a schematic illustration of a magnetic field measurement from the Y component direction.

Similarly, from Eq. 2, in ZF environment, scanning the magnetic field By 150 produces a narrow ZF resonance Ry of height Hy and width Wy as shown in FIG. 5. Therefore, because the photodetector output changes substantially as a function of the By field 150, the magnetometer is also highly sensitive to changes in the magnetic field in the y-direction.

Figure 6:
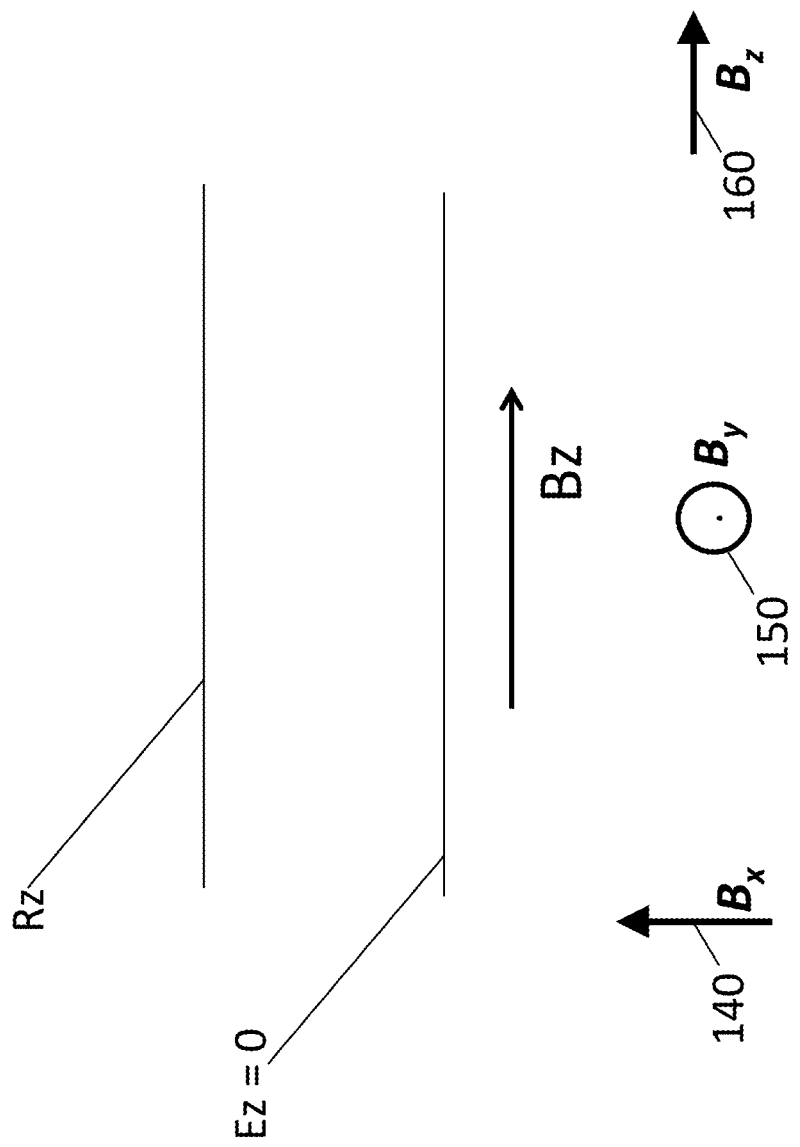
FIG. 6 is a schematic illustration of a magnetic field measurement from the Z component direction.

However, from Eq. 2, in ZF environment, scanning the magnetic field Bz 160 does not produce any change in the photodetector 90 output as shown in FIG. 6. Therefore, the magnetometer is not sensitive to changes in the magnetic field in the z-direction. And therefore, a traditional ZF-PRM cannot measure all three components in the same location at one time.

Figure 3:
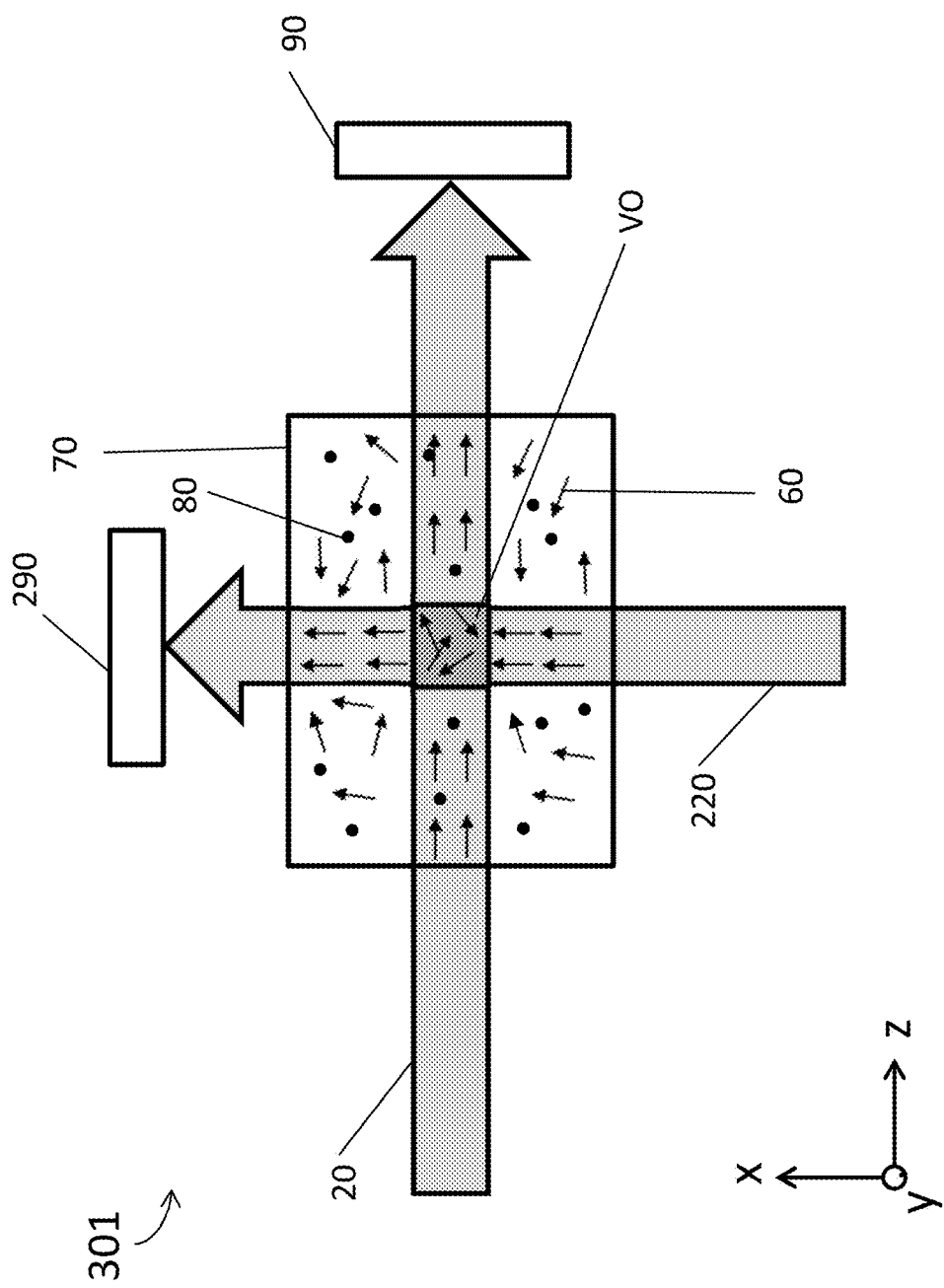
FIG. 3 is a schematic illustration of a triaxial ZF-PRM of the present disclosure.

The ZF-PRM as described herein and essentially shown in FIG. 3, 301, is sensitive to changes in the magnetic field in all three directions, X, Y and Z. In the triaxial ZF-PRM 301, two circularly polarized light beams 20, 220 are projected through a single vapor cell 70 housing a group of alkali atoms 60 and at least one buffer gas 80. The cell may have lateral dimensions of each side of generally about one millimeter (mm), two mm, or three mm, or larger. In 301, the light source 10 lens 30, polarizer 40, and waveplate 50 used in FIG. 1, and other optical components are not shown for clarity. The circularly polarized light beams 20, 220 may be produced by a single light source or multiple light sources.

In the ZF-PRM 301 of FIG. 3, two photodetectors 90, 290 measure optical power in light beams 20, 220 respectively after the circularly polarized light beams pass through the vapor cell 70 containing alkali atoms 60 and buffer gas 80. The alkali atoms 60 employed may include rubidium, cesium, potassium and sodium. The buffer gas may comprise a noble gas such as helium, argon, xenon or neon. Another gas such as nitrogen can also be used as buffer gas 80. The buffer gas may comprise of a mixture of gases or a single component gas.

The circularly polarized light beams 20, 220 are designed to both be resonant with the D1 transition of the alkali atoms 60 and both beams are substantially circularly polarized as described above for FIG. 1. The circularly polarized beams 20 and 220 may be derived from the same light source or from distinct light sources. The beams are projected through the vapor cell 70 containing the alkali atoms 60 and buffer gas 80 at substantially orthogonal or perpendicular directions from each other. Coils, not shown, may create magnetic fields in the x, y, and z directions.

Referring to the ZF-PRM of FIG. 3, 301 the light beam 20 measures magnetic field in the x and 7 directions. The light beam 220 measures magnetic field if the y and z directions. When the beams are offset so as not to occupy the same space or volume, or in other words overlap each other inside the vapor cell, the beam and photodetector it falls on, beam 20 for instance, and photodetector 90, or beam 220 and photodetector 290, operate independently to each measure in two directions even if the other beam is interrupted or fails. This creates a robust apparatus that can measure in at least two directions with only one light beam being operational, but in three directions if both beams are functioning. This is in opposition to prior art pump-probe magnetometers wherein the linearly polarized light beam and circularly polarized light beam overlap and where if one fails or is interrupted no detection or signal may be derived from the other.

For the purposes of the present description, the term "modulation" is used to describe periodic variations in either a field or an electrical current that drives a coil. Similarly, the term "modulate" is defined herein to be the act of apply such modulation. Specifically, the terms "modulate" and "modulation" apply to periodic variations that enable error signal generation, as one example, through the lock-in detection technique. The term lock-in detection is known in the art. The term "scan" or "scanning" is used in conjunction with a parameter and is defined herein to mean the act of changing a parameter to make a manual (visual) or computer-aided observation. As an example, one may scan the field to observe the shape of the zero-field resonance using an oscilloscope. The "scan" need not be periodic as is required with "modulation". The term "optimizing a zero-field resonance" is used herein in to describe the minimizing the width and maximizing the height of the ZF resonance. Further, the act of nulling a field, wherein in the field is effectively equal to zero, can occur when the width of the measured resonance is minimized and height is maximized, and is therefore said to be optimized.

Further, the one or more coils may be an additional single coil, or an additional two coils, or set of coils, or the sole coil, or coils, or set of coils of the magnetometer. Coils may be a means for generating an oscillating magnetic field. Further, the term "coil" is known in the art and defined to be an object that can produce a tunable magnetic field. One example of a coil is a wire that has been wound in a circular shape through which electrical current is passed to produce a magnetic field. Other geometries of a coil could include, but are not limited to a Helmholtz coil pair, a round solenoid, or a wire wrapped in rectangular-shaped windings. Herein the term "null" means to apply a field to cancel a component of the background field. As one example of the term "null", an x-bias coil is positioned with the axis of the coil along the x-direction.

Orthogonal direction means perpendicular,or substantially perpendicular, or at a right angle to, at substantially a right angle to, wherein substantially may be defined as no more than about ten degrees from the ninety degree or right angle, or no more than about nine degrees, or no more than about eight degrees, or no more than about seven degrees, or no more than about six degrees, or no more than about five degrees, or no more than about four degrees, or no more than about three degrees, or no more than about two degrees, or no more than about one degree, or at ninety degrees or a right angle. For the purposes of the present application the term "field" when not accompanied by a qualifier is defined to mean magnetic field. A field has both direction and magnitude and herein the term "field component" refers to the field along a given direction. The terms photodiode and photodetector may be interchangeable.

Now referring to FIG. 7A, the overlap of the beams inside the vapor cell 70, should be minimized by methods known in the art which may be either a reduction of beam circumference or diameter, or offset of beams, in other words engineered to create space between where the beams fall inside the vapor cell. As illustrated in FIG. 7A, circularly polarized light beam 20 derives its signal from the atoms it lands on inside the vapor cell 70, defined as beam volume 1. Laser beam 220 derives its signal from the atoms it lands on, being beam volume 2. When the beams overlap, as in FIG.7A, a volume of overlap is created, volume O. Volume O is defined as the volume inside the vapor cell 70 where the two beams 20 and 220 overlap.

In the region in which the two beams overlap, volume O, the alkali atoms are partially depolarized, and the spin polarization axis is rotated. The reduction in spin polarization from beam overlap lowers the magnetometer sensitivity, and the changes in the spin polarization axis can introduce measurement inaccuracies. Such effects from beam overlap can be readily modeled using Bloch equation. It is therefore desirable to minimize the beam overlap volume, volume O, to the greatest extent possible. Ideally, the overlap volume, volume O, should be minimized, as such volume O, may be three-fourths the volume 1 or volume 2, or one-half the volume 1 or volume 2, or one-quarter, or less, being substantially zero.

The overlap region can be reduced by shaping the light beam cross-sections or by intentionally aligning the beams to not intersect such that the light beam overlap region is reduced to an extent that is practical. FIG. 7B illustrates a system where the beams have been aligned such that a gap exists between beams 20 and 220 wherein the light beam 20 passes through the vapor cell 70 and the light beam 220 passes through the vapor cell 70 and do not substantially intersect or cross each other. Laser beam 20 derives its signal from the atoms it lands on in the vapor cell 70, defined as beam volume 1. Laser beam 220 derives its signal from the atoms it lands on, being beam volume 2. Because the beams have been offset, such that substantially no portion of the beams occupy the same space in the vapor cell 70, the beam overlap volume, volume O, is reduced to essentially zero, thereby minimizing adverse effects from beam overlap.

In addition to reducing beam overlap, increasing the pressure of one or more buffer gases within the vapor cell 70 helps keep alkali atoms confined within the beam volume over a time scale comparable to the ground state coherence time of the alkali atoms. The pressure in the vapor cell may be increased to over 100 torr or higher, for example up to 3000 torr. The high pressure buffer gas helps confine spin polarized alkali atoms within the beam volume 1 and 2 and prevents migration of spin polarized atoms from one beam volume to another over a time scale comparable to the coherence time of the alkali atom ground states.

With the triaxial ZF-PRM 301 illustrated in FIG. 3, because the circularly polarized light beam 20 travels through the vapor cell in the z-direction, the photodetector 90 output is proportional to $P_{z1}$, where $P_{z1}$ is given by $$P_{z1} \propto \frac{B_z^2 + \left(\frac{R}{\gamma}\right)^2}{B_x^2 + B_y^2 + B_z^2 + \left(\frac{R}{\gamma}\right)^2} \quad \text{Eq. 3}$$

Similarly, because the circularly polarized light beam 220 travels through the vapor cell in the x-direction, the photodetector 290 output is proportional to $P_{x2}$, where $P_{x2}$ is given by $$P_{x2} \propto \frac{B_x^2 + \left(\frac{R}{\gamma}\right)^2}{B_x^2 + B_y^2 + B_z^2 + \left(\frac{R}{\gamma}\right)^2} \qquad \text{Eq. 4}$$

From Eqn. 3, in ZF, scanning the magnetic field in the X-direction produces the ZF resonance $Rx_1$ as shown in FIG. 8A. Similarly, scanning magnetic field in the y-direction produces resonance $Ry_1$ as seen in FIG. 8B. However, scanning the magnetic field in the Z-direction does not change the photodiode output and zero field resonance is not observed, FIG. 8C. Thus, the output of the photodiode 90 is sensitive to magnetic fields in the X and Y directions, but not the Z direction.

Similarly, from eqn. 4, as shown in FIG. 9B, in ZF, scanning the magnetic field in the Y-direction produces a magnetic resonance $Ry_2$ and scanning the magnetic field in the z-direction produces resonance $Rz_2$ FIG. 9C. Thus, the output of the photodiode 290 is sensitive to magnetic fields in the Y and Z directions, but not the X direction, as shown in FIG. 9A.

By utilizing the photodetector FIG. 3, 90 output to sense magnetic fields in the X and Y direction, and by using the photodetector FIG. 3, 290 to sense the magnetic field in the Z and Y direction, the triaxial ZF-PRM magnetometer 301 can sense magnetic field in all three orthogonal directions with high sensitivity at the same time and in substantially the same location.

Signal processing techniques are generally used to obtain a response that is linearly proportional to the background magnetic field. In ZF magnetometers, a commonly used technique to obtain a linear output proportional to magnetic field is using phase sensitive detection with a lock-in amplifier to generate a dispersive line shape, or error signal, from the Lorentzian shaped ZF resonance signal as shown in FIG. 4 for example, where Rx is the ZF resonance obtained by scanning magnetic field in the x-direction and Ex is the error signal generated from Rx using signal processing (Schwindt and Johnson 2012). The reason error signal is used as the output of the magnetometer is because the error signal has a steep linear slope about zero field, where as the ZF resonance has quadratic slope about zero field. It is well known in the art that the error signal can be generated by first applying a magnetic field modulation in the direction of the desired magnetic field sensitive axis, and then demodulating the photodiode output using synchronous phase detector such as a lock-in amplifier.

Figure 10:
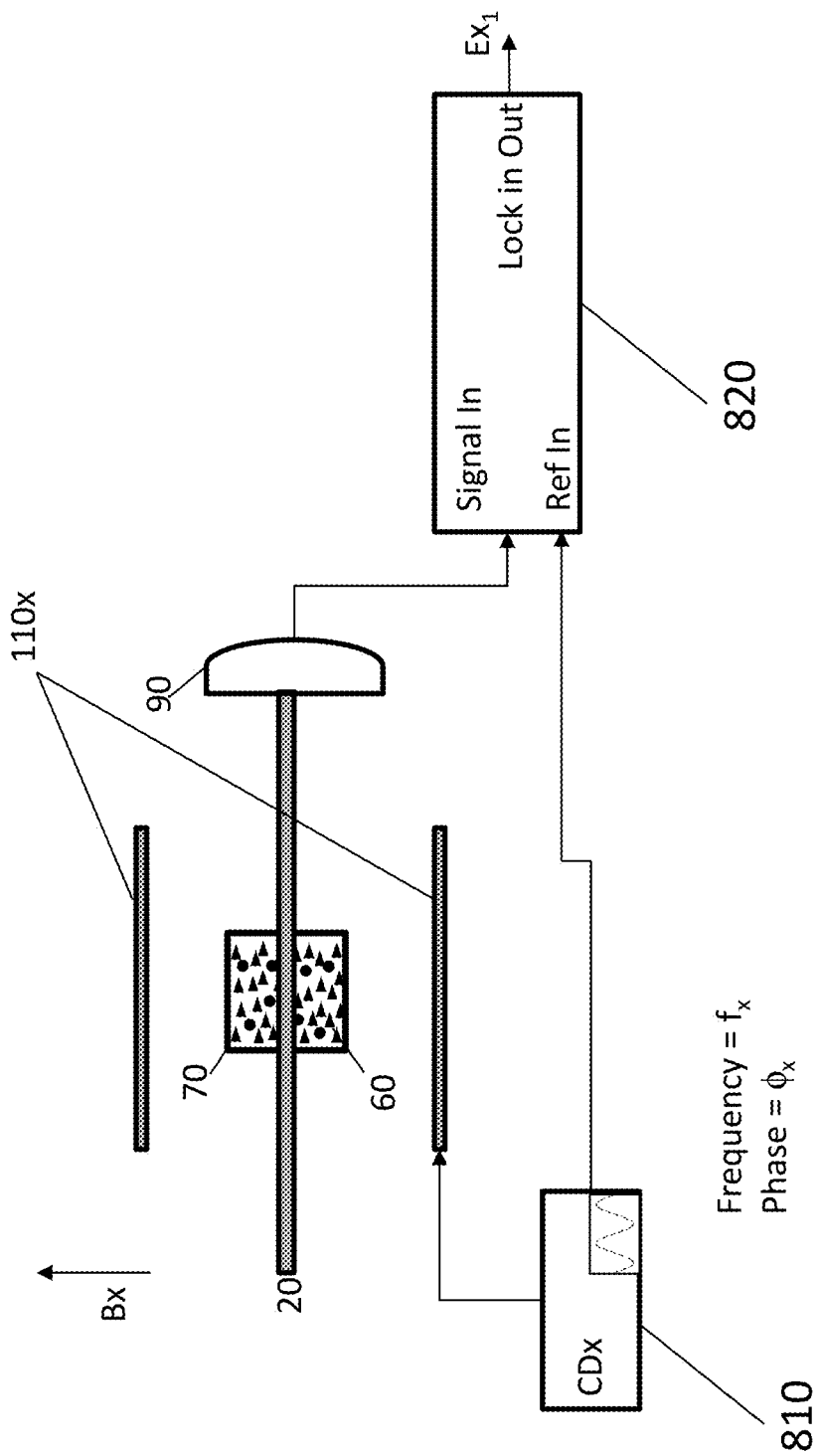
FIG. 10 is a schematic illustration of how an error signal is generated.

For example, the error signal $Ex_1$ can be generated as follows as shown schematically in FIG. 10. First, an oscillating electrical current is applied to coils $110x$ using coil driver 810 to produce an oscillating magnetic field at the location of the vapor cell 70. The oscillating electrical current generated by the coil driver 810 $CD_x$ can be a periodic waveform of frequency $f_x$ and phase $\Phi_x$. Example waveforms include but not limited to sine wave or square wave. The oscillating magnetic field causes the spin polarization of the alkali atoms 60 inside the vapor cell 70 to oscillate, which in turn produces an oscillation in the amount of light 20 transmitted through vapor cell and measured by the photodiode 90. Using the waveform used to generate the oscillating magnetic field in the x-direction as the reference input, and the photodiode 90 output as the input signal to the lock-in amplifier 820, the error signal $Ex_1$ is produced by the lock-in amplifier 820.

In an identical fashion, the error signal $Ez_2$ be generated by applying a modulation field in the z-direction and then demodulating the photodetector 290 output using a separate lock in amplifier. Similarly, the error signal $Ey_1$ and $Ey_2$ can be produced by applying a modulation field in the y-direction and then demodulating the photodiode 90 output using a locking amplifier to produce $Ey_1$ and/or using output of the other photodetector 290 to produce $Ey_2$. A sum or linear combination of the both photodetector signals can also be used to produce y-error signal output which gives the sum or linear combination of $Ey_1$ and $Ey_2$. The error signals $Ex_1$, $Ez_2$, and either $Ey_1$ or $Ey_2$ or linear combination of $Ey_1$ and $Ey_2$ are the three outputs of the triaxial magnetometer.

Coils or other means may be employed to generate oscillating magnetic field over the region of the vapor cell in two or more directions. The frequency of the oscillating magnetic field may be different in three mutually orthogonal directions. The frequency of the oscillating magnetic field may be the same in at least two directions and different in the third direction. The frequency of the oscillating magnetic field may be the same in all three mutually orthogonal directions. The frequency of the oscillating magnetic field may be the same in all three mutually orthogonal directions and the phase of the oscillating magnetic field is offset by an amount substantially equal to $\pi/2$ in at least two mutually orthogonal directions.

While various embodiments have been described in detail, it is apparent that modifications and adaptations of those embodiments will occur to those skilled in the art. However, is to be expressly understood that such modifications and adaptations are within the spirit and scope of the present disclosure.

EXAMPLES

Example 1

Figure 11:
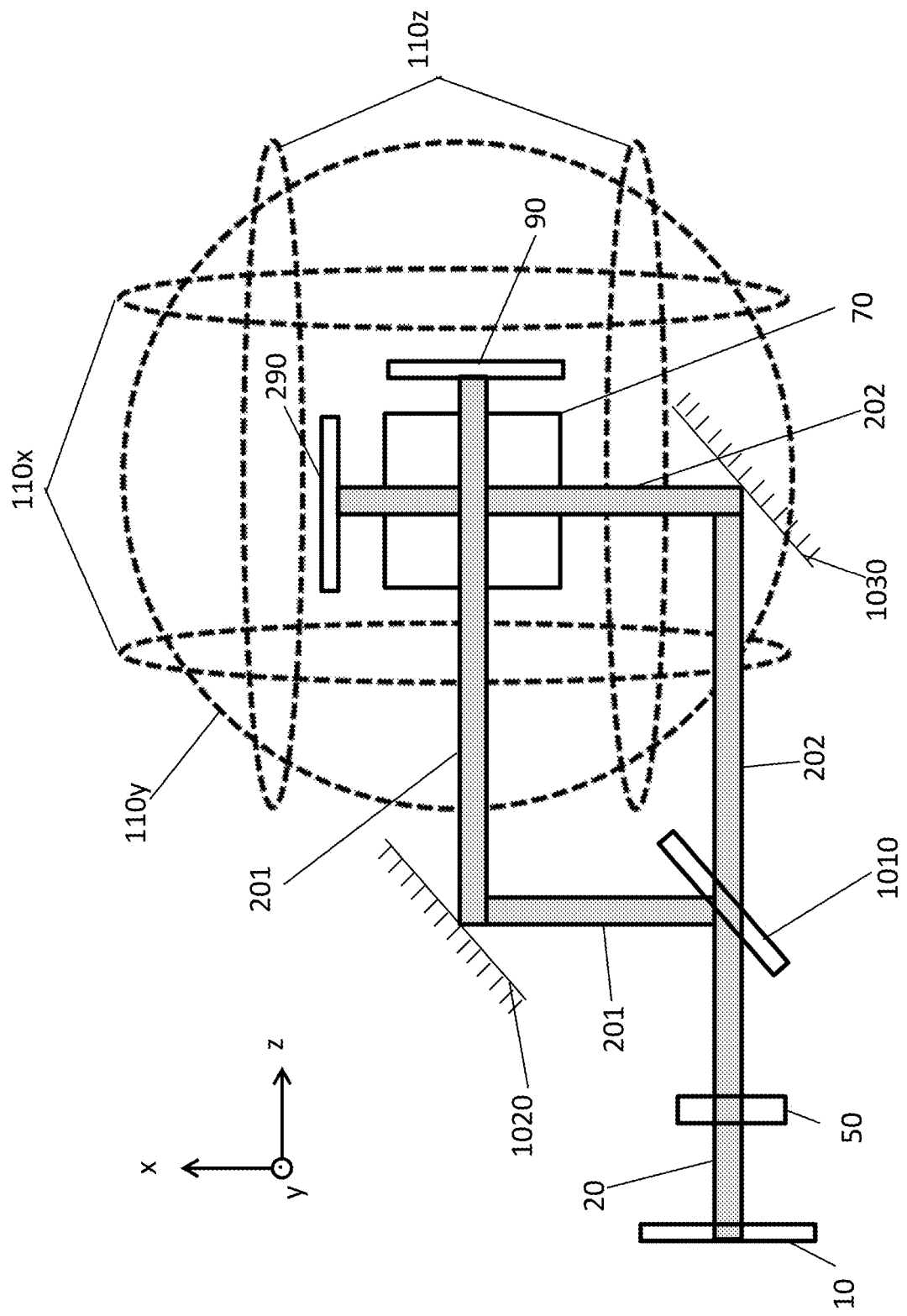
FIG. 11 is a schematic illustration of an example triaxial ZF-PRM of the present description.

In this example illustrated in FIG. 11, a 795 nm laser 10 tuned to the D1 transition of the $^{87}$Rb atoms was used to generate light for optical pumping. The beam 20 exiting the laser may be collimated using an optical lens (not shown) if the initial output from the laser has high divergence or convergence. The full width at half maximum (FWHM) beam diameter was about 1 mm for example in this case. The beam diameter can be bigger or smaller but preferably less than half the inside height, width or depth dimensions of the vapor cell 70.

The light beam 20 was converted to circular polarization using a 795 nm quarter waveplate 50. The light beam 20 was then split into two parts 201, 202 using a 50:50 optical beam splitter 1010. The beam 201 was reflected using a mirror 1020 such that it passed through the vapor cell 70 travelling in the z-direction. After passing through the vapor cell, the beam 201 was captured by a photodiode 90 sensitive to light at 795 nm. The photodiode converted the laser light falling on the photodetector to an electrical current.

Similarly, the beam 202 was reflected using mirror 1030 such that it passed through the vapor cell 70 travelling in the x-direction. After passing through the vapor cell 70, the beam 202 was captured by the photodiode 290.

The vapor cell 70 was 3×3×3 mm in this example and filled with a droplet of enriched $^{87}$Rb and nitrogen at a pressure over 100 torr. Helium could be used instead of nitrogen. The buffer gas minimizes the diffusion of $^{87}$Rb atoms from one beam 201, 202 to another over the timescale of $^{87}$Rb ground state coherence, being 1 millisecond (ms). But could be as little as 0.1 ms or as long as 10 ms.

A small modulating current was added to each of the three coil pairs 110x, 110y, and 110z. The modulation currents produced an oscillating magnetic field at the location of the vapor cell 70. For example, coil 110x was modulated such that it produces a magnetic field $Bm_x=A_x \sin(2\pi f_x+f_x)$ oscillating in the x-direction, coil 110y produces a magnetic field $Bm_y=A_y \sin(2\pi f_y+f_y)$ oscillating in the y-direction, and coil 110z produces magnetic field $Bm_z=A_z \sin(2\pi f_z+f_z)$ oscillating in the z-direction. The amplitude and the frequency of the modulation field were chosen to maximize error signal generation as well as to reduce technical low frequency noise (Shah and Romalis 2009). For example, $A_x$, $A_y$, and $A_z$ can range from 1 to 1000 nT and the $f_x$, $f_y$, $f_z$ can be in the range of 100 Hz to 10 kHz. The phase $f_x$, $f_y$, $f_z$ can be in the range of 0 to $2\pi$. The modulation function can be any periodic function such as but not limited to sine wave, square wave, triangle wave.

To generate an error signal from the photodetector output, synchronous phase sensitive detection was used. Following is the description of one method to generate the three error signals corresponding to the three open-loop outputs of the triaxial magnetometer. Additional ways exist for generating error signals that are well known to people skilled in art.

We refer to the amplified current-to-voltage converted output of the photodetector 90 to be $PD_{90}$. Similarly, we refer to the amplified current-to-voltage converted output of the photodetector 290 to be $PD_{290}$.

The error signal $Ez_2$ was generated by multiplying $PD_{290}$ with a periodic function of frequency $f_z$. For example, $PD_{290}$ can be multiplied with $\sin(2\pi f_z+f_{Lz})$, where $f_{Lz}$ is chosen to maximize the amplitude and slope of the error signal, $Ez_2$. Example $f_{Lz}=f_z+\pi/2$. The multiplied output was then low pass filtered with the filter cutoff frequency set to be less than $f_z$. The filtered output was the error signal $Ez_2$. The photodiode output $PD_{290}$ was chosen to generate $Ez_2$ because beam 202 travels through the vapor cell in the x-direction which is orthogonal to the z-direction and therefore the ZF resonance in the z-direction was observed using $PD_{290}$.

Similarly, the error signal $Ex_1$ was generated by multiplying $PD_{90}$ with a periodic function of frequency $f_x$. For example, $PD_{90}$ is multiplied with $\sin(2\pi f_x+f_{Lx})$, where $f_{Lx}$ was chosen to maximize the amplitude and slope of the error signal, $Ex_1$. Example $f_{Lx}=f_x+\pi/2$. The multiplied output was then low pass filtered with the filter cutoff frequency set to be less than $f_x$. The filtered output was the error signal $Ex_1$. The photodiode output $PD_{90}$ was chosen to generate $Ex_1$ because beam 201 travels in the z-direction through the vapor cell, which is orthogonal to the x-direction and therefore $Ex_1$ was observed using $PD_{90}$.

A procedure similar to $Ex_1$ and $Ez_2$ was used to generate the error signal Ey1 or Ey2, wherein the photodiode output was first multiplied with a periodic function of frequency $f_y$, and then a low pass filter was applied to the multiplied product with low pass filter cutoff less than $f_y$. In the case of error signal for the y direction, because the y-direction is orthogonal to the propagation direction of both beams 201, 202 through the vapor cell, either of the two photodiode outputs $PD_{90}$ or $PD_{290}$ or a linear combination of $PD_{90}$ and $PD_{290}$ can be used to generate the error signal in the y direction.

The error signal $Ey_1$ ($Ey_2$) was generated by multiplying $PD_{90}$ ($PD_{290}$) with a periodic function of frequency $f_y$. For example, $PD_{90}$ ($PD_{290}$) was multiplied with $\sin(2\pi f_y+f_{Ly})$, where $f_{Ly}$ is chosen to maximize the amplitude and slope of the error signal, $Ey_1$ ($Ey_2$). Example $f_{Ly}=f_y+\pi/2$. The multiplied output was then low pass filtered with the filter cutoff frequency set to be less than $f_y$. The filtered output was the error signal $Ey_1$ ($Ey_2$). Either $Ey_1$ or $Ey_2$ can be used as the y-axis output of the magnetometer. A sum or a linear combination of $Ey_1$ or $Ey2$ may also be used at the y-axis magnetometer output. The main difference between Ey1 and Ey2 is that Ey1 is produced from sampling the atoms in volume 1 by beam 201 and Ey2 is produced from sampling of the atoms in volume 2 by beam 202.

Modulation frequencies $f_x$, $f_y$, $f_z$ and the phase $\Phi_x$, $\Phi_y$, $\Phi_z$ can be chosen to be the same or distinct based on technical constraints of the setup as well as to reduce crosstalk between the outputs. Crosstalk is defined as the response in the $j^{th}$ error signal output when magnetic field changes in the $i^{th}$ direction. For example, when magnetic field changes in the x-direction, only Ex is ideally expected to reflect this field change. However, any response observed in Ey or Ez error signal is referred to as the crosstalk between x and y axis or between x and z axis.

A few advantageous configurations are the following.

Case 1. $f_x \neq f_y \neq f_z$
Case 2. $f_x=f_z \neq f_y$
Case 3. $f_x=f_z=f_y$ Case 1 uses three separate modulation frequencies which is expected to produce the lowest crosstalk. The phases $f_x$, $f_y$, $f_z$ in this case can be chosen to optimize slope and amplitude of individual error signals.

Case 2 has the benefit of requiring only two separate frequencies. In case 2, choosing $f_x=f_z+\pi/2$ is expected to result in the lowest crosstalk from simulations using Bloch equations.

Case 3 is particularly advantageous configuration because it allows all coils to be modulated at the same frequency which reduces interference from beat notes between frequencies $f_x$, $f_y$, $f_z$. To minimize crosstalk, the modulation phase for example can be chosen to be $\Phi_z=\Phi_x=\Phi_y+\pi/2$.

In Case 2 and Case 3 in which the modulation frequency is the same in two or more directions, it is understood that an equivalent magnetic field pattern can be created using fewer coils. For example, a single coil with a correct orientation can generate the same magnetic field pattern that is created when modulation currents at the same frequency are separately applied to coils 110x, 110x and 110z.

Example 2

Figure 12:
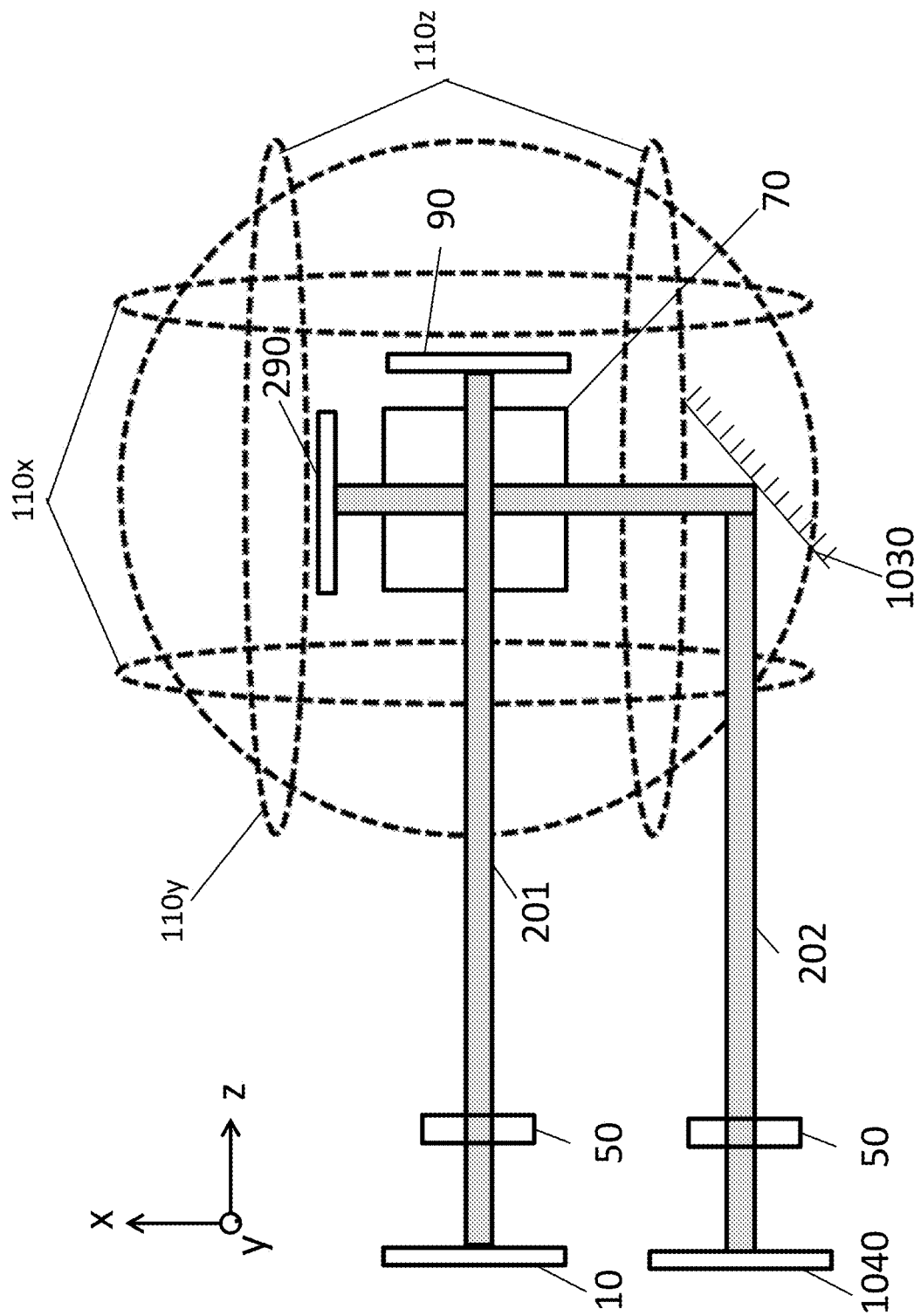
FIG. 12 is a schematic illustration of an example triaxial ZF-PRM of the present description.

In this example, as shown in FIG. 12, two separate 795 nm lasers 10, 1040 tuned to the D1 transition of the $^{87}$Rb atoms, are used to generate light beams 201,202 for optical pumping. Besides the use of the two lasers 10, 1040 the apparatus and method for measuring the three magnetic components were the same and followed the same method as presented in Example 1.

REFERENCES

Boto, Elena, Niall Holmes, James Leggett, Gillian Roberts, Vishal Shah, Sofie S. Meyer, Leonardo Duque Muñoz, et al. 2018. "Moving Magnetoencephalography towards Real-World Applications with a Wearable System." *Nature* 555 (7698): 657-61. https://doi.org/10.1038/nature26147.

Budker, Dmitry, and Michael Romalis. 2007. "Optical Magnetometry." *Nat Phys* 3 (4): 227-34. https://doi.org/10.1038/nphys566.

Dong, H. f., J. c. Fang, B. q. Zhou, X. b. Tang, and J. Qin. 2012. "Three-Dimensional Atomic Magnetometry." *The European Physical Journal-Applied Physics* 57 (02): null-null. https://doi.org/10.1051/epjap/2011110392.

Dupont-Roc, J., S. Haroche, and C. Cohen-Tannoudji. 1969. "Detection of Very Weak Magnetic Fields (10-9gauss) by 87 Rb Zero-Field Level Crossing Resonances." *Physics Letters A* 28 (9): 638-39. https://doi.org/10.1016/0375-9601 (69)90480-0.

Fang, Jiancheng, and Jie Qin. 2012. "In Situ Triaxial Magnetic Field Compensation for the Spin-Exchange-Relaxation-Free Atomic Magnetometer." *The Review of Scientific Instruments* 83 (10): 103104. https://doi.org/10.1063/1.4756046.

Happer, W., and B. S. Mathur. 1967. "Effective Operator Formalism in Optical Pumping." *Physical Review* 163 (1): 12. https://doi.org/10.1103/PhysRev.163.12.

Huang, H. C., H. F. Dong, X. Y. Hu, L. Chen, and Y. Gao. 2015. "Three-Axis Atomic Magnetometer Based on Spin Precession Modulation." *Applied Physics Letters* 107 (18): 182403. https://doi.org/10.1063/1.4935096.

Huang, Haichao, Haifeng Dong, Lin Chen, and Yang Gao. 2016. "Single-Beam Three-Axis Atomic Magnetometer." *Applied Physics Letters* 109 (6): 062404. https://doi.org/10.1063/1.4960971.

Marie-Anne, Bouchiat, Brossel Jean, Cohen-Tannoudji Claude N, Dupont-Roc Jacques A, Haroche Serge, Kastler Alfred H, and Lehmann Jean-Claude. 1971. Paramagnetic resonance and optical pumping magnetometer in the near zero magnetic field-range. U.S. Pat. No. 3,629,697 A, filed Dec. 10, 1969, and issued Dec. 21, 1971. http://www.google.com/patents/US3629697.

Osborne, J., J. Orton, O. Alem, and V. Shah. 2018. "Fully Integrated, Standalone Zero Field Optically Pumped Magnetometer for Biomagnetism." In *Steep Dispersion Engineering and Opto-Atomic Precision Metrology XI*, 10548: 105481G. International Society for Optics and Photonics. https://doi.org/10.1117/12.2299197.

Schwindt, Peter, and Cort N. Johnson. 2012. Atomic magnetometer. United States U.S. Pat. No. 8,212,556B1, filed Jan. 12, 2010, and issued Jul. 3, 2012. https://patents.google.com/patent/US8212556B1/en?oq=US+8%2c212%2c556+B1.

Seltzer, S. J., and M. V. Romalis. 2004. "Unshielded Three-Axis Vector Operation of a Spin-Exchange-Relaxation-Free Atomic Magnetometer." *Applied Physics Letters* 85 (20): 4804-6. https://doi.org/doi:10.1063/1.1814434.

Shah, V., and M. V. Romalis. 2009. "Spin-Exchange Relaxation-Free Magnetometry Using Elliptically Polarized Light." *Physical Review A* 80 (1): 013416. https://doi.org/10.1103/PhysRevA.80.013416.

Shah, Vishal, and Kenneth Jeramiah Hughes. 2015. Method for detecting zero-field resonance.

United States U.S. Pat No. 9,116,201B2, filed Jan. 30, 2015, and issued Aug. 25, 2015. https://patents.google.com/patent/US9116201B2/en.

Shah, Vishal, Svenja Knappe, Peter D. D. Schwindt, and John Kitching. 2007. "Subpicotesla Atomic Magnetometry with a Microfabricated Vapour Cell." *Nat Photon* 1 (11): 649-52. https://doi.org/10.1038/nphoton.2007.201.

Slocum, Robert E., and Francis N. Reilly. 1963. "Low Field Helium Magnetometer for Space Applications." *IEEE Transactions on Nuclear Science* 10 (1): 165-71. https://doi.org/10.1109/TNS.1963.4323257.

W, Fan, and Otten E. 1974. Miniature optically pumped magnetometer probe using light pipes to transmit light to the probe. U.S. Pat. No. 3786340 A, filed Jul. 13, 1971, and issued Jan. 15, 1974. http://www.google.com/patents/US3786340.

Weinstock, H. 1996. *SQUID Sensors: Fundamentals, Fabrication and Applications* (*NATO Science Series E*: 1st ed. Springer.

The invention claimed is:

1. A zero-field paramagnetic resonance magnetometer (ZF-PRM) able to simultaneously measure magnetic field in three orthogonal directions, being x, y, and z, at substantially the same location comprising:
   a) a first circularly polarized light beam, a vapor cell filled with alkali atoms and a buffer gas, and a first photodetector to detect changes in the magnetic field in a first direction chosen from x, y, and z, and optionally second direction chosen from the remainder of x, y, or z, wherein the detected changes using the first photodetector define a first measurement set which is a measure of the magnetic field in the chosen direction, and the first and optionally second directions are mutually orthogonal to each other and orthogonal to the direction of propagation of the first light beam through the vapor cell;
   b) a second circularly polarized light beam, the vapor cell filled with alkali atoms and the buffer gas, and a second photodetector to detect changes in the magnetic field in a third direction chosen from x, y, and z and optionally the first or the second direction chosen from x, y, and z, wherein the detected changes using the second photodetector define a second measurement set which is a measure of the magnetic field in the chosen directions being the third and first or second, and the third and optionally first or second directions are all three mutually orthogonal and orthogonal to the direction of propagation of the second light beam through the vapor cell;
   c) wherein the first and second light beams pass through the vapor cell in substantially orthogonal directions;
   d) wherein the first and second measurement sets are not dependent on each other; and
   e) wherein the first and the second measurement sets together measure magnetic field in all three substantially orthogonal directions.

2. The ZF-PRM of claim 1 further comprising a beam splitter, and wherein the first and the second light beams are generated by splitting light from a single light source.

3. The ZF-PRM of claim 1, wherein the first and the second light beams are generated by two separate light sources.

4. The ZF-PRM of claim 1, wherein the ZF-PRM is surrounded by a coil system that produces an oscillating magnetic field over the region of the vapor cell in two or more directions.

5. The ZF-PRM of claim 4, wherein the frequency of the oscillating magnetic field is different in three mutually orthogonal directions.

6. The ZF-PRM of claim 4, wherein the frequency of the oscillating magnetic field is the same in at least two directions and different in a third direction.

7. The ZF-PRM of claim 4, wherein the frequency of the oscillating magnetic field is the same in all three mutually orthogonal directions.

8. The ZF-PRM of claim 4, wherein the frequency of the oscillating magnetic field is the same in all three mutually orthogonal directions and the phase of the oscillating magnetic field is offset by an amount substantially equal to $\pi/2$ in at least two mutually orthogonal directions.

9. The ZF-PRM of claim 1, wherein the buffer gas in the vapor cell has a pressure greater than 100 torr.

10. The ZF-PRM of claim 1, wherein a volume of beam overlap inside the vapor cell is defined as the space where the beams overlap inside the vapor cell, and wherein the volume of beam overlap is substantially less than the total volume occupied by both beams inside the vapor cell.

11. The ZF-PRM of claim 1, wherein the first and the second beams do not overlap inside the vapor cell.

12. A triaxial ZF-PRM comprising:
  a) two circularly polarized light beams resonant with a D1 line of a group of alkali atoms;
  b) a single vapor cell filled with the group of alkali atoms and at least one buffer gas, wherein the two light beams are directed through the vapor cell at substantially orthogonal directions, and wherein the light beams occupy a volume within the vapor cell, and wherein an overlap volume is defined by the volume where the beams overlap inside the vapor cell, and wherein the overlap volume is substantially smaller than the total beam volumes in the vapor cell; and
  c) two photodiodes, wherein a first photodiode measures magnetic field in one or two directions orthogonal to the propagation direction of the beam detected by the first photodiode, and a second photodiode measures magnetic field in one or two directions orthogonal to the propagation direction of the beam detected by the second photodiode.

13. The triaxial ZF-PRM of claim 12 further comprising a beam splitter, and wherein the first and the second light beams are generated by splitting light from a single light source.

14. A method for measuring magnetic frequency in three directions simultaneously, the method comprising the steps of:
  a) propagating two circularly polarized light beams through a vapor cell containing alkali atoms and at least one buffer gas at substantially orthogonal directions to each other, and wherein the light beams occupy a volume within the vapor cell, and wherein an overlap volume is defined by the volume where the beams overlap inside the vapor cell, and wherein the overlap volume is substantially smaller than the total beam volumes in the vapor cell; and
  b) using two separate photodetectors to detect the two beams after they pass through the vapor cell.

15. The method of claim 14 further comprising creating an oscillating magnetic field over the region of the vapor cell in two or more directions.

16. The method of claim 15, wherein the frequency of the oscillating magnetic field is different in three mutually orthogonal directions.

17. The method of claim 15, wherein the frequency of the oscillating magnetic field is the same in at least two directions and different in the third direction.

18. The method of claim 15, wherein the frequency of the oscillating magnetic field is the same in all three mutually orthogonal directions.

19. The method of claim 15, wherein the frequency of the oscillating magnetic field is the same in all three mutually orthogonal directions and the phase of the oscillating magnetic field is offset by an amount substantially equal to $\pi/2$ in at least two mutually orthogonal directions.

20. The method of claim 14 further comprising pressurizing the vapor cell to a pressure greater than 100 torr.

* * * * *